United States Patent
Shima

(10) Patent No.: US 7,177,161 B2
(45) Date of Patent: Feb. 13, 2007

(54) COMPACT RADIO EQUIPMENT AND METHOD OF MOUNTING THE SAME

(75) Inventor: Makoto Shima, Kakegawa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/933,226

(22) Filed: Sep. 3, 2004

(65) Prior Publication Data

US 2005/0052858 A1 Mar. 10, 2005

(30) Foreign Application Priority Data

Sep. 5, 2003 (JP) .............................. 2003/313493

(51) Int. Cl.
*H05K 9/00* (2006.01)
(52) U.S. Cl. ..................... 361/816; 361/800; 361/818; 361/814; 174/350; 174/377; 174/387
(58) Field of Classification Search ................ 361/800, 361/816, 818, 752, 753, 799, 814; 174/35 R, 174/35 GC, 35 MS, 32, 387, 395, 396, 350, 174/377
See application file for complete search history.

(56) References Cited

U.S. PATENT DOCUMENTS

| | | | | |
|---|---|---|---|---|
| 4,833,276 A | * | 5/1989 | Ito | ............................. 174/374 |
| 4,948,923 A | * | 8/1990 | Suzuki | ....................... 174/372 |
| 5,027,061 A | * | 6/1991 | Palmer et al. | .............. 324/156 |
| 5,099,396 A | * | 3/1992 | Barz et al. | .................. 361/818 |
| 5,159,537 A | * | 10/1992 | Okano | ......................... 361/816 |
| 5,596,487 A | * | 1/1997 | Castaneda et al. | .......... 361/814 |
| 5,777,856 A | * | 7/1998 | Phillips et al. | .............. 361/816 |
| 5,880,403 A | * | 3/1999 | Czajkowski et al. | ...... 174/35 R |
| 6,122,178 A | * | 9/2000 | Andrews et al. | ........... 361/800 |
| 6,195,244 B1 | * | 2/2001 | Barz | .......................... 361/111 |
| 6,195,267 B1 | * | 2/2001 | MacDonald et al. | ........ 361/800 |
| 6,243,274 B1 | * | 6/2001 | Willis | ......................... 361/816 |
| 6,570,086 B1 | * | 5/2003 | Shimoji et al. | ............. 174/377 |
| 6,590,783 B2 | * | 7/2003 | Spratte et al. | ............... 361/800 |
| 6,621,910 B1 | * | 9/2003 | Weckstrom et al. | ........ 381/351 |
| 6,872,880 B2 | * | 3/2005 | King et al. | ................. 174/372 |
| 6,914,982 B2 | * | 7/2005 | Toyoda et al. | ......... 379/433.13 |
| 6,967,972 B1 | * | 11/2005 | Volftsun et al. | ............ 370/466 |
| 6,979,774 B2 | * | 12/2005 | Abe et al. | .................... 174/377 |
| 7,005,573 B2 | * | 2/2006 | Lionetta et al. | ............. 174/387 |

FOREIGN PATENT DOCUMENTS

JP 2001-111232 A 4/2001

\* cited by examiner

*Primary Examiner*—Elvin Enad
*Assistant Examiner*—Dameon E. Levi
(74) *Attorney, Agent, or Firm*—Sughrue Mion, PLLC

(57) ABSTRACT

A compact radio equipment includes internal circuits on two or more printed circuit boards electrically connected to each other and securely mounted in structure. With this structure, a first metal shield frame is mounted on a first printed circuit board to cover components mounted on the first printed circuit board. A second printed circuit board is mounted on the first metal shield frame.

17 Claims, 12 Drawing Sheets

COMPACT RADIO EQUIPMENT AND METHOD OF MOUNTING THE SAME

This application claims priority to prior application JP 2003-313493, the disclosure of which is incorporated herein by reference.

BACKGROUND OF THE INVENTION

The present invention relates to a compact radio equipment such as a cell phone or radio communication terminal, and a mounting method thereof.

Conventionally, when electric circuits divided into two or more blocks and mounted on two or more printed circuit boards are mounted in the equipment, a first printed circuit board and a second printed circuit board are electrically connected using one of various kinds of connectors or pin contact systems. A frame is mounted between the first and second printed circuit boards not only to protect the electric circuits on the first printed circuit board, but also position and fix the second printed circuit board (see JP-A-2001-111232).

The conventional frame mentioned above is molded of resin, or made from die cast alloy. The second printed circuit board is secured with screws or engaged with hooks. In case of a resin molded frame, a certain thickness is required in the manufacturing process. The increased thickness of the frame is the cause of preventing the achievement of a small, thin radio equipment design.

The use of screws to secure the second printed circuit board requires an additional step of attaching the screws at manufacturing facilities, and this reduces workability.

On the other hand, the use of hooks to secure the second printed circuit board causes another problem that the hooked portions are susceptible to damage. The die cast alloy is suitable for making the equipment small and thin, but manufacturing costs are high. It may also require an additional step of attaching screws like in the case of resin molding.

Further, the use of a connector or pin contact system to electrically connect the electric circuits on the first printed circuit board and the electric circuits on the second printed circuit board is not enough to supply adequate ground potential. Therefore, a resin molded frame with aluminum deposited on it is used as a conduction material. In other words, metal springs or pins are mounted on the first and second printed circuit boards so that they will electrically contact the aluminum deposited frame. Thus, the supply of the ground potential is enhanced.

However, since aluminum deposition is expensive, the cost of a resin molded frame with aluminum deposited on it becomes high.

Further, since the resin molded frame with aluminum deposited on it is of a contact type, adequate conductivity cannot be obtained. In this case, since not only is the supply of the ground potential inadequate, but the thermal conductivity is also insufficient, heat may be built up in a local place.

SUMMARY OF THE INVENTION

It is therefore an object of the present invention to provide compact radio equipment and its mounting method, which can connect two or more printed circuit boards and mount them in the equipment in such an efficient manner that can achieve a small, thin equipment design, improve electrical, mechanical, and heat measures, and enable cost cutting.

According to the invention of a first aspect, a compact radio equipment includes internal circuits on two or more printed circuit boards electrically connected to each other and securely mounted in structure.

With this structure, a first metal shield frame is mounted on a first printed circuit board to cover components mounted on the first printed circuit board. A second printed circuit board is mounted on the first metal shield frame.

Preferably, the second printed circuit board is electrically and mechanically connected to the first metal shield frame so that a bottom surface layer opposite to a component mounting surface is a ground layer.

Preferably, the second printed circuit board is electrically connected to the first metal shield frame so that a bottom surface layer opposite to a component mounting surface is a ground layer, and the second printed circuit board is structured by a radio circuit.

Preferably, a second metal shield frame is provided to cover the second printed circuit board. In this event, the second metal shield frame is mounted on the first metal shield frame. Alternatively, the second shield frame is mounted on the second printed circuit board.

For example, the compact radio equipment serves as a cell-phone or a PHS terminal.

According to the invention of a second aspect, a compact radio equipment includes internal circuits on two or more printed circuit boards electrically connected to each other and securely mounted in structure.

With this structure, a first metal shield frame is mounted on a first printed circuit board to cover first components mounted on the first printed circuit board. A second metal shield frame is mounted on a second printed circuit board to cover second components mounted on the second printed circuit board. In this case, a first top plate of the first metal shield frame and a second top plate of the second metal shield frame are connected to each other.

For example, the compact radio equipment serves as a cell-phone or a PHS terminal.

DESCRIPTION OF PREFERRED EMBODIMENTS

At first, brief description will be made of a feature of the present invention with reference to drawings.

Figure 1:
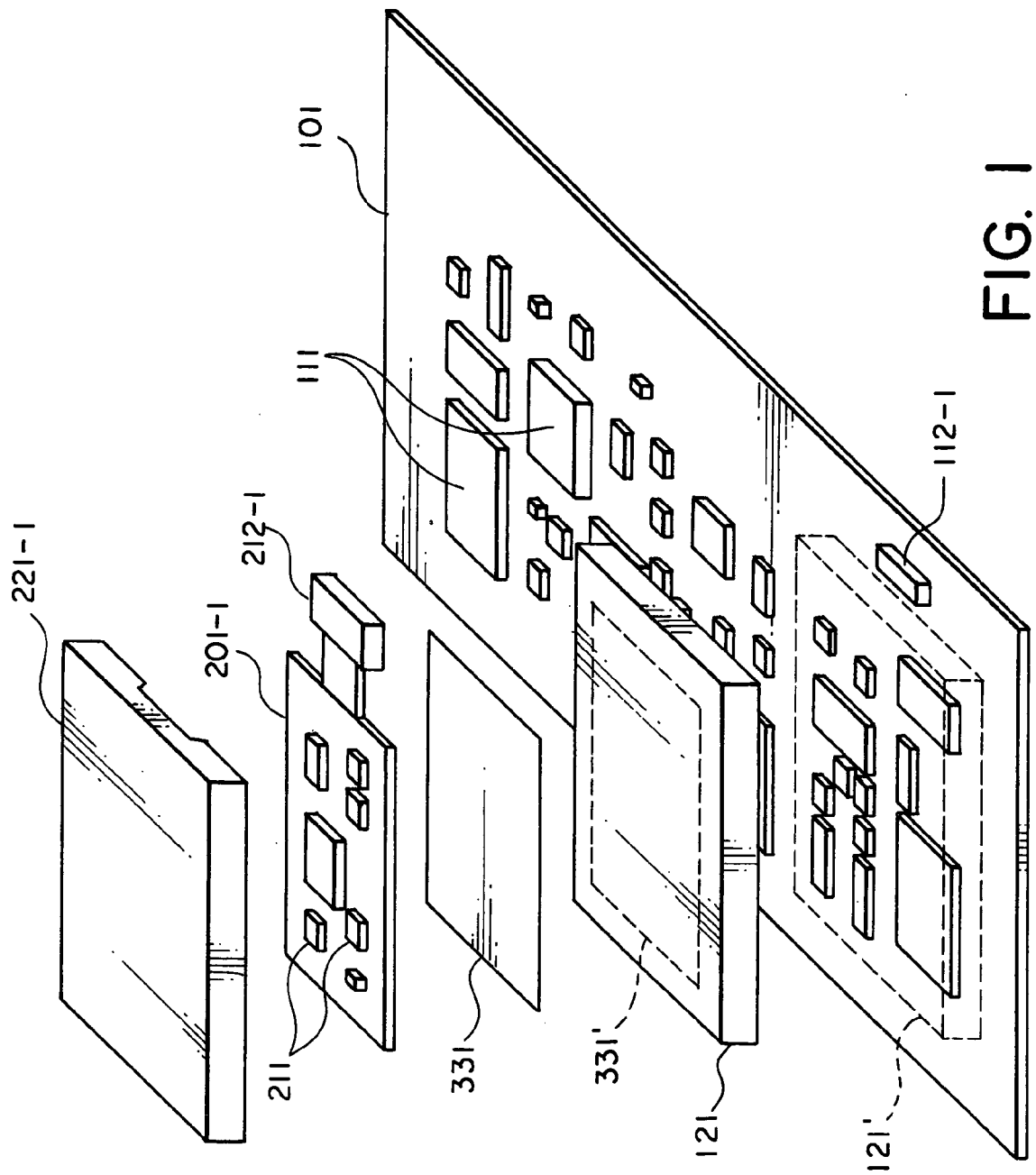
FIG. 1 is an exploded perspective view of a first embodiment of compact radio equipment to which a mounting method for compact radio equipment according to present invention is applied.

As shown in FIG. 1, the compact radio equipment according to the present invention has such a structure that second electric circuits 211 are arranged on a shield frame 121 mounted over first electric circuits 111 on a first printed circuit board 101. In this structure, the first electric circuits or radio circuits 111 on the first printed circuit board 101 is electrically connected with the second electric circuits or radio circuits 211. A second printed circuit board 201-1 is mechanically secured to the first printed circuit board 101. This structure makes it possible to improve the stability of the electric circuits, radio properties, mechanical strength, and heat radiation efficiency. Compared with conventional mounting methods, cheap components can be used, so that cost-cutting effect is also expected.

In FIG. 1, the first shield frame 121 is mounted over the first electric circuits 111 on the first printed circuit board 101. The shield frame 121 is made of conductive metal, and covers some of the electric circuits on the first printed circuit board 101 that cause noise or need to avoid the influence of noise, thus improving antinoise characteristics.

On the other hand, a second shield frame 221-1 is mounted over the electric circuits on the second printed circuit board 201-1. The second shield frame 221-1 is made of conductive metal, and covers all or some of the electric circuits on the second printed circuit board 201-1 that cause noise or need to avoid the influence of noise, thus improving antinoise characteristics.

The electric circuits on the first printed circuit board 101 are electrically connected with those on the second printed circuit board 201-1 by a connector 112-1 and a receptor 212-1. The shield frame 121 is soldered to the first printed circuit board 101. The second shield frame 221-1 and the second printed circuit board 201-1 are mounted on the top surface of the first shield frame 121 to improve mounting efficiency. On the other hand, the first shield frame 121 and the second shield frame 221-1 improve the antinoise characteristics of the electric circuits.

The entire surface layer on the bottom side (that is, the surface opposite to the component mounting surface or the side of the second shield frame 221-1) of the second printed circuit board 201-1 is formed to have ground potential and connected to the first shield frame 121 by a jointing material 331. Since both the shield frames 121 and 221-1 are made of conductive metal, heat generated from each electric circuit can be transferred to the printed circuit boards 101, 201-1, and the shield frames 121, 221-1, and dissipated from each of the electric circuits 111, 211 into the printed circuit boards 101, 201-1, and the shield frames 121, 221-1.

Thus, according to the present invention, among two or more electric circuits and the printed circuit boards 101, 201-1 with the electric circuits mounted on them, the first shield frame 121 of conductive metal is mounted over at least some of the electric circuits on the first printed circuit board 101. Two or more shield frames of conductive metal are formed to cover at least some of the electric circuits on two or more printed circuit boards. Then, the two or more shield frames and the two or more printed circuit boards are mounted on the first shield frame 121 mounted on the first printed circuit board 101. This structure can improve not only mounting efficiency but also heat radiation efficiency from the electric circuits, thereby improving antinoise characteristics and electrical properties. Since the shield frames 121 and 221-1 can be made of stainless steel or phosphor bronze plated with nickel as long as it is conductive metal, cost cutting is also possible.

Upon connecting two or more printed circuit boards, they can be mounted in the equipment in such an efficient manner that can make the equipment small and thin, improve electrical, mechanical, and heat measures compared to the conventional, and enable cost cutting.

An embodiment of the present invention will now be described with reference to FIG. 1.

In FIG. 1, the second printed circuit board 201 with the second electric circuits 211 mounted on it and the second shield frame 221-1 formed to cover the second electric circuits 211 are mounted on the top of the first shield frame 121 formed to cover at least some of the first electric circuits 111 on the first printed circuit board 101. It is noted here that each of the shield frames 121 and 221-1 has a box shape with a cover top but no bottom.

Both the shield frames 121 and 221-1 are made of conductive metal that can be soldered to each of the printed circuit boards 101 and 201-1, so that there is no need to use fixation elements like screws to fix each frame, thereby simplifying the shape of both the shield frames 121 and 221-1.

These shield frames 121 and 221-1 can be made from a cheap metal plate, such as of stainless steel or phosphor bronze. Such a metal plate is easy to machine and hence can reduce manufacturing costs. Further, since the metal plate is thin but stiff, it can reduce the total thickness of the equipment with high mechanical strength. Each of the shield frames 121 and 221-1 covers at least some of the electric circuits not only to suppress the noise radiated from the electric circuits, but also to shield the electric circuits in the shield frames 121 and 221-1 from the noise radiated from the other electric circuits. Further, since the printed circuit boards 101 and 201-1 can be soldered, their conductivity is more improved than contact type boards to increase their thermal conductivity, so that the heat generated from the electric circuits on the printed circuit board 101 can be dissipated into the shield frames 121 and 221-1, and the other printed circuit board 201-1, thus improving heat radiation efficiency.

The entire surface layer on the bottom side (on the side of the first shield frame 121) of the second printed circuit board 201-1 is formed to have ground potential. When the second printed circuit board 201-1 is mounted on the top of the first shield frame 121 and connected to the first printed circuit board 101, the electric circuits 111 and the electric circuits 211 are connected by the connector 112-1 and the receptor 212-1. The bottom face of the second printed circuit board 201-1 and the top plate of the first shield frame 121 are connected by the jointing material 331. This way of connection improves conductivity, so that the ground potential for the first electric circuits 111 can be made equal to the ground potential for the second electric circuits 211, thereby improving electrical properties and thermal conductivity.

In case where the second electric circuits 211 are high-frequency radio circuits, if the bottom face of the second printed circuit board 201-1 is brought as close to the top plate of the first shield frame 121 as possible, the bottom face of the second printed circuit board 201-1 and the top plate of the first shield frame 121 will be able to function as a capacitor to stabilize RF ground potential.

(First Embodiment)

Subsequently, description will be made of a first embodiment of the present invention.

(Structure of First Embodiment)

As shown in FIG. 1, the compact radio equipment according to the present invention includes the first printed circuit board 101, the first electric circuits 111, the first shield frame 121, the second printed circuit board 201-1, the second electric circuits 211, the second shield frame 221-1, the connector 112-1, the receptor 212-1, and the jointing material 331.

In addition to these circuit components, the compact radio equipment shown in FIG. 1 is made up of a main-unit case 1, an antenna 2, a battery 3, switches 4, a display 5, etc.

In FIG. 1, the first electric circuits 111 and the second electric circuits 211 are electric circuits of the compact radio equipment, and they are divided into blocks and mounted on two or more printed circuit boards due to limitations on mounting size and electrical properties.

The first printed circuit board 101 and the second printed circuit board 201-1 mount the first electric circuits 111 and the second electric circuits 211, respectively, with signal patterns formed on their surfaces or in their internal layers, thus forming the electric circuitry of the compact radio equipment. The connector 112-1 and the receptor 212-1 electrically connect the first electric circuits 111 and the second electric circuits 211 through the power, signal, and ground lines. The connector 112-1 may be a stacking type connector, or of the type into which a flexible substrate is inserted. In other words, any part or shape can be used for the connector 112-1 as long as it connects the electric circuits 211 on the second printed circuit board 201-1 with the electric circuits 111 on the first printed circuit board 101.

Although the receptor 212-1 assumes the form of a stacking receptor part attached to the second printed circuit board 201-1, if the second printed circuit board 201-1 takes the form of a flexible substrate with a contact terminal area formed on it, there will be no need to attach the stacking receptor part. Like the connector 112-1, any part or shape can be used for the receptor 212-1 as long as it connects the electric circuits 211 on the second printed circuit board 201-1 with the electric circuits 111 on the first printed circuit board 101.

The second printed circuit board 211 consists of two or more layers. Signal patterns for connection between electric components on the second electric circuits 211 are formed on the top surface layer or in the internal layers. The layer on the bottom side is a ground layer the entire surface of which is covered with an exposed copper foil layer, or plated with gold or nickel, or coated with silver so that it can contact the first shield frame 121 and the jointing material 331 for conduction of electricity.

In general, compact radio equipment includes electric circuits that cause noise, such as a high-speed CPU, a step-up charge pump, and a radio transmitter, and electric circuits that are susceptible to noise, such as an analog voice circuit, a radio receiver, and the radio transmitter. Since these electric circuits are mounted on the same printed circuit board or in the same equipment, noise from one electric circuit may affect another electric circuit. It is therefore practical to think out the mounting layout that can mount the electric circuits in such a manner to eliminate interference between the electric circuits and hence reduce the influence of various types of noise.

The first shield frame 121 combines, into a block, the electric circuits that cause noise or the electric circuits that are susceptible to noise, and covers the block. In this case, if the electric circuit block covered by the first shield frame 121 is formed in a rectangular shape, the shape of the first shield frame 121 can also be rectangular. Such a simple shape makes it easy to manufacture the first shield frame 121 and hence reduces the cost. It is preferable to solder the first shield frame 121 to the first printed circuit board 101.

An automatic mounting machine has recently been used to mount electric circuit components on a printed circuit board. Since such an automatic mounting machine can also be used to mount the first shield frame 121, the mounting cost can also be reduced in the manufacturing process. Solder joints are formed to have ground potential. It is therefore preferable that the area of the solder joints should be large enough for the first shield frame 121 to have the same ground potential as the first printed circuit board 101. As the ground potential of the first shield frame 121 gets closer to the ground potential of the first printed circuit board 101, the action of the electric circuits covered by the first shield frame 121 is stabilized, thereby improving antinoise characteristics.

Indicated by dashed lines 121' in FIG. 1 is the mounting location of the first shield frame 121 on the first printed circuit board 101.

Like the first shield frame 121, the second shield frame 221-1 combines, into a block, the electric circuits 211 that cause noise or the electric circuits 211 that are susceptible to noise, and covers the block. Although it is also preferable that the second shield frame 221-1 be formed in a rectangular shape like the first shield frame 121, it may be formed in a different shape according to the limitations on case size and the like.

The second shield frame 221-1 is internally mounted on the top plate of the first shield frame 121 and soldered to the first shield frame 121. Alternatively, hooks (not shown) may be attached to both of the shield frames 121 and 221-1 and engaged with each other. In either the case where both the shield frames 121 and 221-1 are soldered, or the case where they are engaged with hooks, it is preferable that the bottom face of the second shield frame 221-1 and the top plate of the first shield frame 121 should contact in a large area, such as to bring the inner side faces of the second shield frame 221-1 into contact with the outer side faces of the first shield frame 121. This reduces the ground potential difference between both shield frames, 121 and 221-1, so that the action of the second electric circuits 211 covered by the second shield frame 221-1 will be stabilized, thereby improving antinoise characteristics.

The jointing material 331 is to connect the second printed circuit board 201 and the first shield frame 121. In this case, a double-sided conductive tape is used as the jointing material 331 not only to electrically connect the second printed circuit board 201 and the first shield frame 121 in such a manner that they have the same ground potential, but also to mechanically mount and fix the second printed circuit board 201-1 onto the first shield frame 121.

Indicated by dashed lines 331' in FIG. 1 is the mounting location of the jointing material 331 on the outside surface (top surface) of the top plate of the first shield frame 121.

Figure 2:
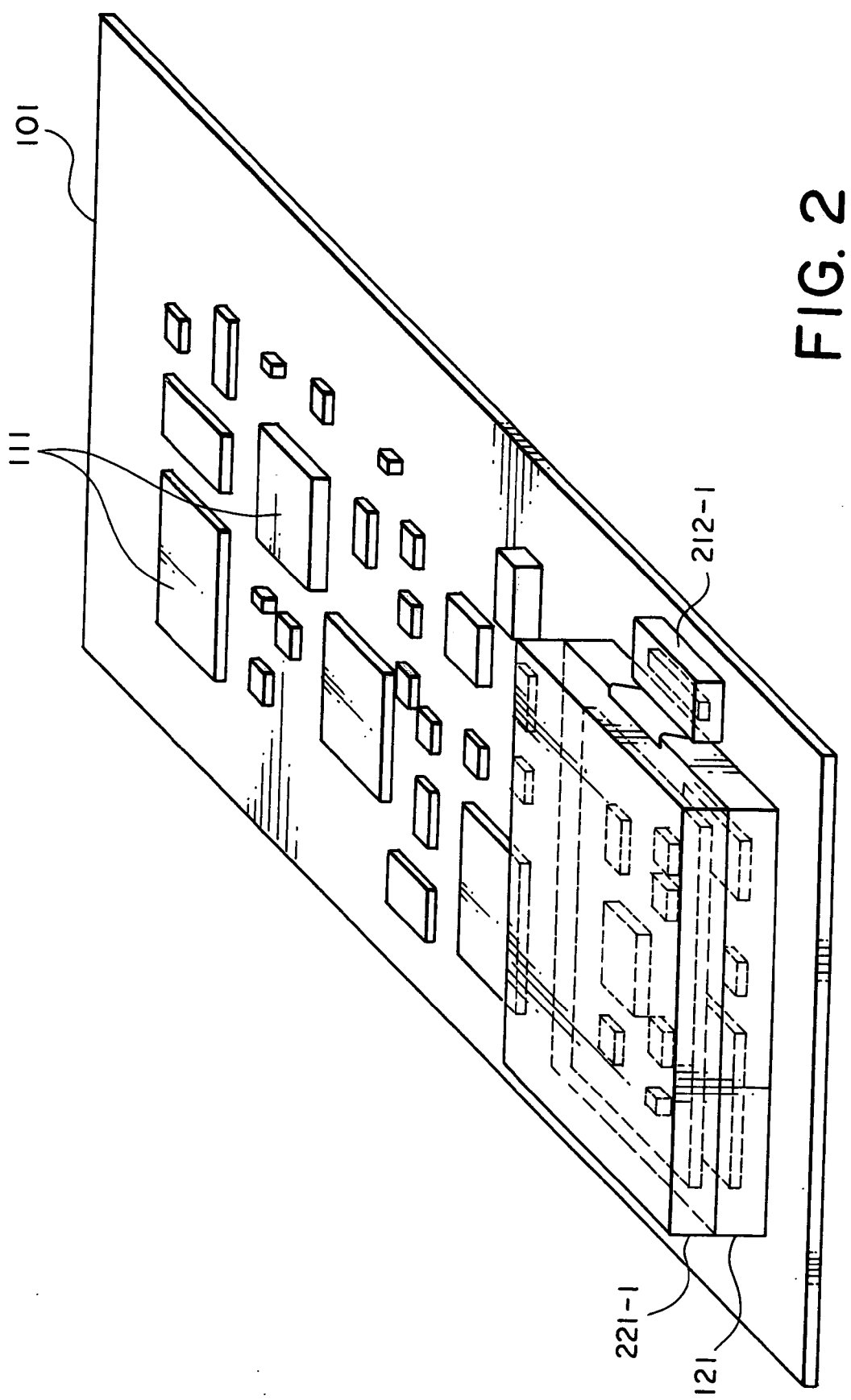
FIG. 2 is a perspective view showing a state in which first electric circuits, a first shield frame, a second printed circuit board, second electric circuits, and a second shield frame, all of which are shown in FIG. 1, are mounted.

As illustrated in FIG. 2, all the structural components of the present invention shown in FIG. 1, namely, the first electric circuits 111, the first shield frame 121, and the second printed circuit board 201 (see FIG. 1), the second electric circuits 211, the second shield frame 221-1, and the connector 112-1 (see FIG. 1), and the receptor 212-1 and the jointing material 331 (see FIG. 1) are mounted on the first printed circuit board 101.

Figure 3:
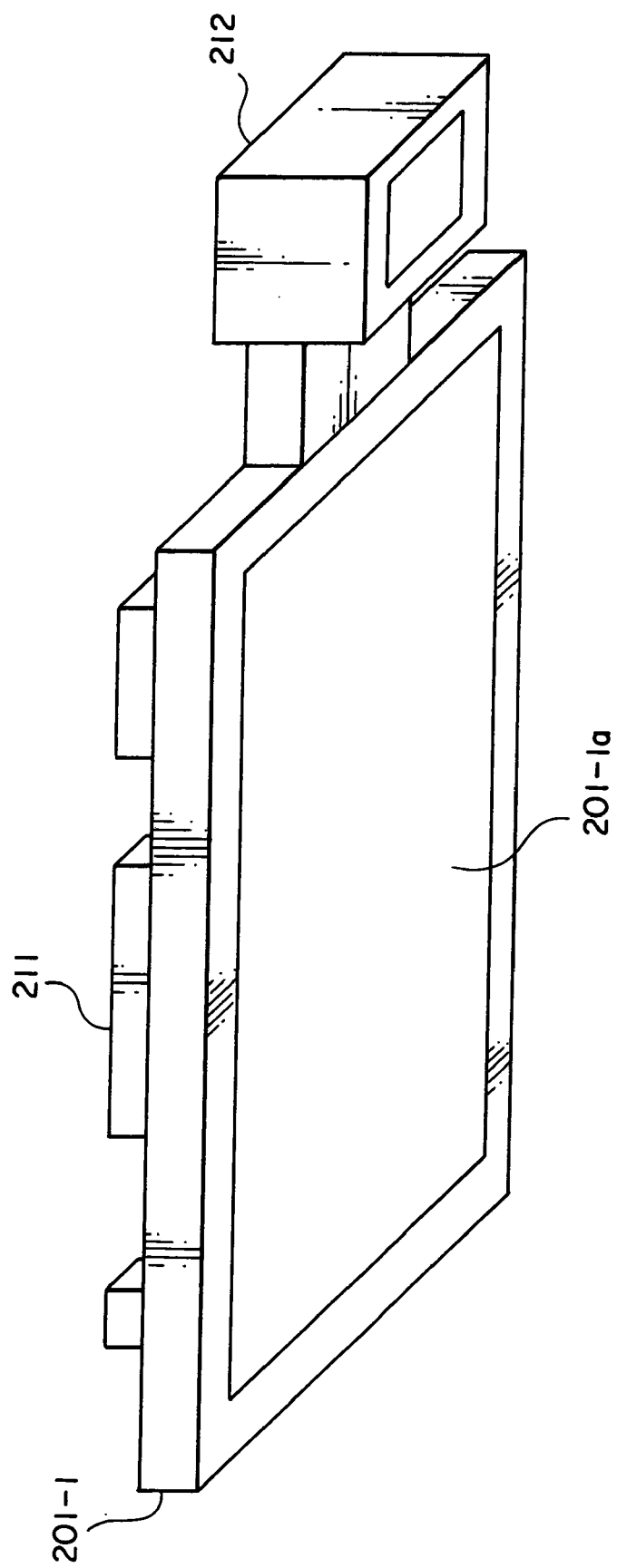
FIG. 3 is a perspective view as seen from the bottom side of the second printed circuit board of FIG. 1.

As shown in FIG. 3, the bottom layer (hatched part 201-1*a* in FIG. 3) of the second printed circuit board 201-1 is formed in a ground pattern, the entire surface of which is covered with an exposed copper foil layer, or plated with gold or nickel, or coated with silver so that it can contact the first shield frame 121 and the jointing material 331 for conduction of electricity.

Figure 4:
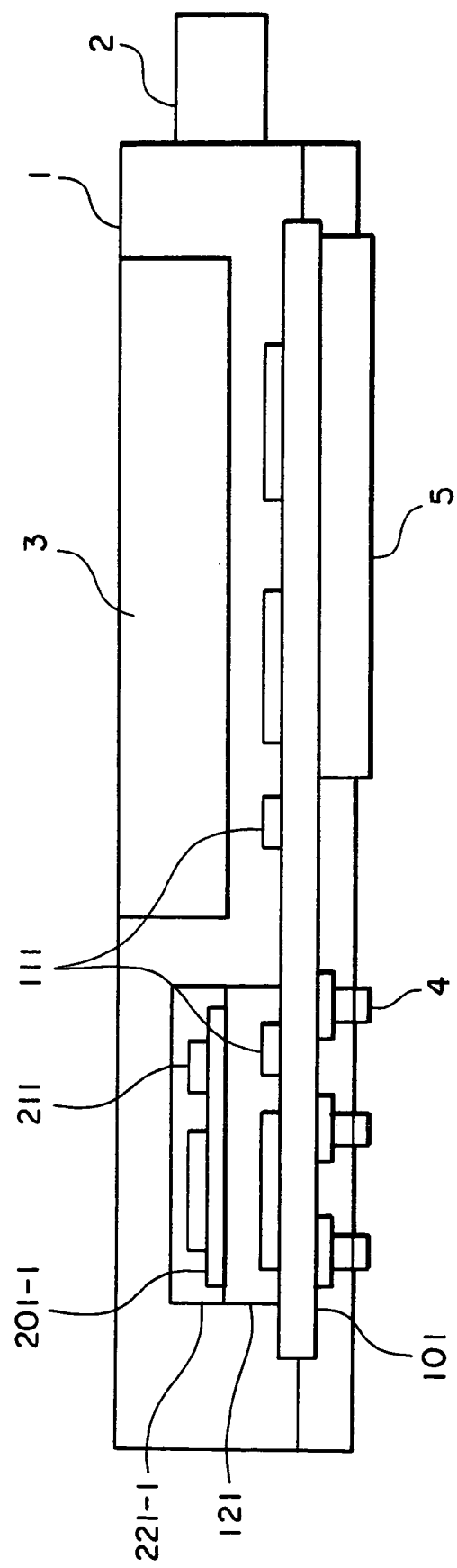
FIG. 4 is a structural drawing of the compact radio equipment according to the present invention.

FIG. 4 is a structural drawing of the compact radio equipment according to the present invention. It shows a state in which all the structural components of the compact radio equipment of the present invention, that is, the first printed circuit board 101 and all the components mounted on the first printed circuit board 101 are arranged in the case 1.

Figure 5:
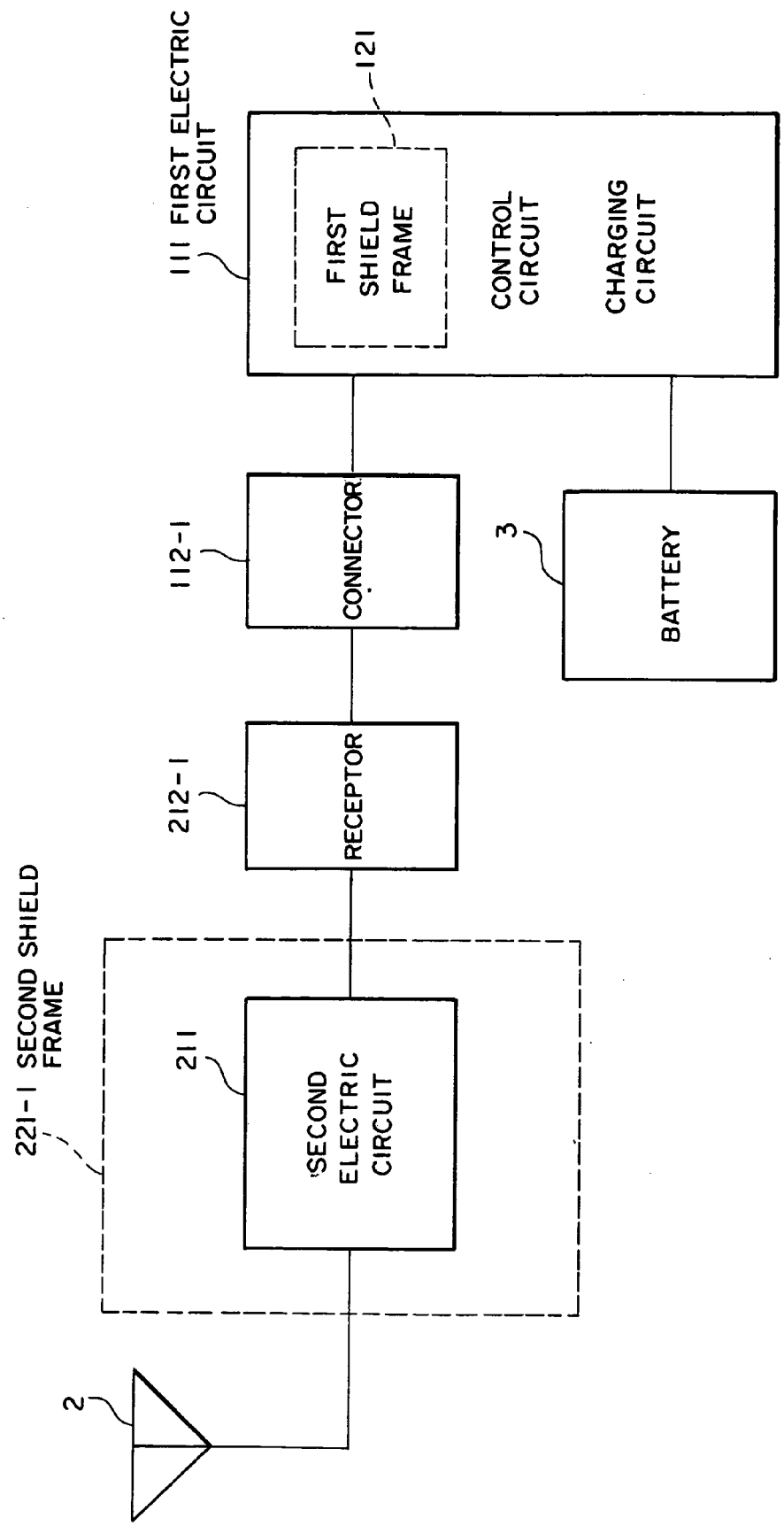
FIG. 5 is a block diagram showing the electric circuitry of the compact radio equipment according to the present invention.

FIG. 5 is a block diagram showing the electric circuitry of the compact radio equipment according to the present invention.

Indicated by dashed lines (121, 221-1) in FIG. 5 are shield frame blocks in each of which an electric circuit covered by each of the shield frames is named.

(Operation of First Embodiment)

As shown in FIG. 4, the compact radio equipment includes the printed circuit boards 101, 201-1 as a structure for its electric circuitry, the main-unit case 1, the antenna 2, the battery 3, the switches 4, and the display part 5. In addition, other unillustrated components, such as a loudspeaker, a vibrator, and a camera, are mounted in the case. Thus, although the compact radio equipment includes lots of components, it must be compact and thin to keep its portability.

As compact radio terminals grow more sophisticated, the number of parts or components increases. The CPU and its clock frequency also become faster. There is also an increased demand for the compact radio equipment typified by a cell phone to have additional functions, which in turn increases the demand for a technique for mounting both the radio circuits for the cell phone functions and the radio circuits for the additional functions. For example, secondary radio circuits for the additional functions, such as for GPS (Global Positioning System), BLUETOOTH, radio, and television, need mounting.

The cell phone system may vary from country to country, or from provider to provider. In such a case, if the compact radio equipment needs to support two or more systems, two or more radio circuits corresponding to the two or more systems need to be mounted in the compact radio equipment.

Thus, as compact radio equipment grows more sophisticated, more functional, and more complex, the demand for smaller, thinner equipment also increases. For these reasons, there are the needs to improve mounting efficiency and to reduce or control radio noise increased with the demand for more sophisticated equipment, as well as cutting the cost of the equipment.

Like the printed circuit boards 101 and 201-1 shown in FIG. 1 as a structure for the electric circuitry of the compact radio equipment, electric circuits are divided into two or more blocks and mounted on two or more printed circuit boards for various reasons. The reasons include: an increasing number of parts or components; mounting limitations due to the tendency toward smaller, thinner device cases; the demand to avoid the influence of clock noise increased with an increase in clock frequency due to the tendency toward high-performance, multifunctional compact radio equipment; the need to dissipate heat from electric circuits, such as the CPU, the charger, and the power supply; and characteristic limitations such as the need to divide radio circuits used at different frequencies or in different systems.

In FIG. 5, a radio circuit corresponds to one of the second electric circuits 211 of FIG. 1 that are mounted on the second printed circuit board 201-1. The receptor 212-1 and the connector 112-1 of FIG. 5 correspond to the receptor 212-1 and the connector 112-1 of FIG. 1. A control circuit of FIG. 5 corresponds to one of the electric circuits 111 of FIG. 1 that are mounted on the first printed circuit board 101. The control circuit includes a CPU and a clock generator circuit, not shown. These electric circuits cause noise that affects other electric circuits, not shown, such as an analog voice circuit and radio circuits, so that they affect and add constraints to the mounting layout and arrangement of the compact radio equipment.

Measures are taken against the noise sources, such as to step down the power supply voltage and reduce the generation of noise using a bypass capacitor, but such measures are often not enough for high-performance, multifunctional, compact radio equipment to prevent noise interference.

Therefore, as shown in FIG. 1, the electric circuits as noise sources are mounted in a position to be covered by the first shield frame 121. The first shield frame 121 of conductive metal shields electromagnetic wave noise. As a consequence, not only the radiation of noise from the internal electric circuits can be reduced, but also the influence of noise from the outside can be reduced. Further, the first shield frame 121 is soldered to the first printed circuit board 101 so that both the radiation of noise and the noise interference can be reduced. Solder joints are formed to have ground potential. Therefore, if the area of the solder joints is large enough for the first shield frame 121 to have the same ground potential as the first printed circuit board 101, it can be more resistant to the radiation and interference of noise. Moreover, the first shield frame 121 is mechanically fixed to the first printed circuit board 101. Thus, the internal electric circuits can be protected.

The radio circuit is mounted on the second printed circuit board 201-1 shown in FIG. 1. The radio circuit in a cell phone is susceptible to CPU noise or clock noise in the equipment. This causes degradation of radio-property. If the ground potential of the radio circuit is unstable, the property programmatically tends to be degraded. Particularly, as shown in FIG. 1, if the radio circuit and the control electric circuit are connected by the receptor 212-1 and the connector 112-1, it is impossible to obtain sufficient ground potential.

Therefore, according to the present invention, the entire surface layer on the bottom side of the second printed circuit board 201-1 is formed as a ground layer, brought into contact with the jointing material 331, and connected to the first shield frame 121. With this structure, the second printed circuit board 201-1 with the radio circuit mounted on it can have the same ground potential as the first printed circuit board 101. Therefore, both the printed circuit boards 101 and 201-1 are kept stable in ground potential so that the properties of the radio circuit are improved. In addition, the second shield frame 221-1 is mounted on the first shield frame 121 so as to cover the second printed circuit board

201-1. As a consequence, the radiation of noise from the radio circuit and the noise interference for the radio circuit can be reduced.

In general, the cell phone is provided with a transmitter circuit as a radio circuit, not shown, and a battery charger circuit as a control electric circuit. When these electric circuits operate, they generate heat, and during prolonged operation time, the heat is concentrated around the electric circuits. It is a known fact that metal has good electrical conductivity and high thermal conductivity.

According to the present invention, the first printed circuit board 101, the second printed circuit board 201-1, the first shield frame 121, and the second shield frame 221-1 are electrically connected to one another. Therefore, the conductivity between the structural components is high and the thermal conductivity is improved. Under this circumstance, the heat generated from the transmitter circuit or the charger circuit can be dissipated into the printed circuit boards 101 and 201-1, and the shield frames 121 and 221-1. Thus, it is possible to improve heat radiation efficiency.

Further, the first shield frame 121 is mounted on the first printed circuit board 101, and the second printed circuit board 201-1 and the second shield frame 221-1 are mounted on the first shield frame 121. This structure enhances mounting efficiency, and hence makes the equipment smaller and thinner. Since there is no need to use conventional resin molded or die-cast frames, the cost of each component can be reduced. Moreover, additional elements to fix the components are unnecessary. Thus, the cost of the equipment can be suppressed.

Herein, it is assumed that the radio circuit is a high-frequency circuit having a bandwidth on the order of GHz. If the second printed circuit board 201-1 is brought as close to the first shield frame 121 as possible, the copper foil on the bottom face of the second printed circuit board 201-1 and the metal plate of the first shield frame 121 will be able to function as a capacitor so as to conduct the ground potential in the RF band. In this case, the jointing material 331 does not need to be conductive, and it may be ordinary double-sided tape as long as it can fix the second printed circuit board 201-1.

Further, if the second printed circuit board 201-1 is soldered and secured to the first shield frame 121, the double-sided tape to fix the second printed circuit board 201-1 is unnecessary, thereby enabling cost cutting.

Although the first shield frame 121 is mounted over the control electric circuit as the noise source on the first printed circuit board 101, the component to be covered may not be a noise source. For example, the first shield frame 121, on which the second printed circuit board 201 and the second shield frame 221-1 are mounted, may be used as a measure to increase the strength of a CSP type IC. Thus, the structure of the present invention may be used to improve mounting efficiency and workability, and hence to reduce costs, regardless of measures to control noise and heat radiation, and to increase its strength.

In the structure of FIG. 1, although the second shield frame 221-1 is mounted on the first shield frame 121, another structure as shown later in FIG. 11 may be such that a second printed circuit board 201-3 and a second shield frame 221-4 are mounted on a jointing material 331 made of metal plate, and the jointing material 331 is mounted on the first shield frame 121.

When the second printed circuit board 201-1 is mounted on the jointing material 331, soldering properties (solder wettability) should be excellent. In this case, solder joints are provided on the ground potential layer of the second printed circuit board 201-1 so as to increase the area of the solder joints. Thus, the jointing material 331, the printed circuit board 201-1, and the second shield frame 221-1 can have the common ground potential. On the other hand, when the second shield frame 221-1 is mounted on the jointing material 331, they are preferably attached to each other with hooks, or soldered to each other. In either case, the area of the hooks or solder joints is increased so that the jointing material 331 and the second shield frame 221-1 can have the common ground potential. This structure can not only stabilize the action of the second electric circuits 211 to improve antinoise characteristics, but also dissipate heat from the second electric circuits 211 into the second shield frame 221-1 and the jointing material 331 to improve heat radiation properties.

The jointing material 331 thus formed is mounted on the first shield frame 121. It is preferable that the jointing material 331 and the first shield frame 121 should be attached to each other with hooks, or soldered to each other. The area of the hooks or solder joints is increased so that the jointing material 331 and the first shield frame 121 can have the common ground potential. Therefore, their ground potential can also be made equal to the ground potential of the first printed circuit board 101. This structure can increase thermal conductivity not only to improve heat radiation efficiency but also make itself more resistant to the radiation and interference of noise. Thus, the jointing material 331 can be selected from some materials in accordance with the characteristics of the compact radio equipment.

As described above, if the second printed circuit board 201-1 is covered by the second shield frame 221-1 and the jointing material 331 from both sides, the outside surface of the top plate of the second shield frame 221-1 may be connected to and mounted on the outside surface of the top plate of the first shield frame 121. In this case, the first shield frame 121 and the second shield frame 221-1 can serve as a spacer (frame) to combine the first printed circuit board 101 and the second printed circuit board 201-1.

Figure 12:
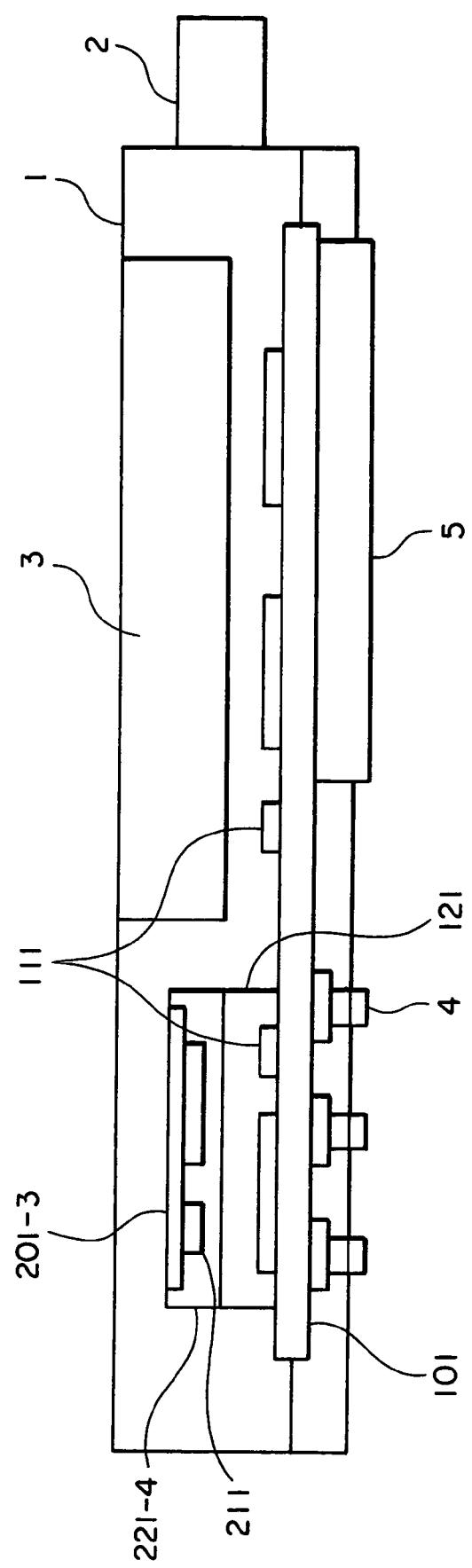
FIG. 12 is a structural drawing of the compact radio equipment shown in FIG. 11.

FIG. 12 is a structural drawing showing the position of the first shield frame 121, the second shield frame 221-1, the first printed circuit board 101, and the second printed circuit board 201 when a metal plate is used as the jointing material 331.

(Effects of First Embodiment)

As mentioned above, according to the embodiment, the first shield frame is mounted on the first printed circuit board, and the second printed circuit board and the second shield frame are mounted on the first shield frame. In this manner, mounting efficiency is improved so as to achieve a smaller, thinner radio terminal design.

The first shield frame 121 and the second shield frame 221-1 are mounted to cover the radio circuits or noise sources, and the electric circuits that are susceptible to noise. As a consequence, radio properties and antinoise characteristics are improved.

Further, the shield frames are formed in a box shape (boxcover shape), and each of the printed circuit boards can be connected to each of the shield frames. This makes it possible to efficiently dissipate heat from the electric circuit components on the print circuit boards and hence to improve heat radiation efficiency.

In addition, conductivity between each shield frame and each printed circuit board is enhanced. Therefore, they can have the same ground potential so as to improve the properties of the radio circuits and the electric circuits and to stabilize the action of each circuit component.

Since the shield frames are made of metal, not only they can be manufactured at low cost, but also the printed circuit boards and the shield frames can be easily connected and secured to each other. Thus, manufacturing costs can be reduced.

Specifically, the shield frames are made by forming a metal plate into a box shape (boxcover shape). Therefore, they can protect the electric circuit components on the printed boards, and can also reinforce the printed circuit boards. Thus, the strength of the equipment can be improved.

As described above, the compact radio equipment according to the present invention can simultaneously meet lots of improvement requirements, such as to make the equipment smaller and thinner, improve mounting efficiency, stabilize the action of the radio circuits and the electric circuits, improve the fixation of two or more printed circuit boards, workability in the manufacturing process, the protection of the electric circuit components on the printed circuit boards, and heat radiation efficiency, reduce costs, etc.

(Second Embodiment)

Subsequently, description will be made of a second embodiment of the present invention.

(Structure of Second Embodiment)

Figure 6:
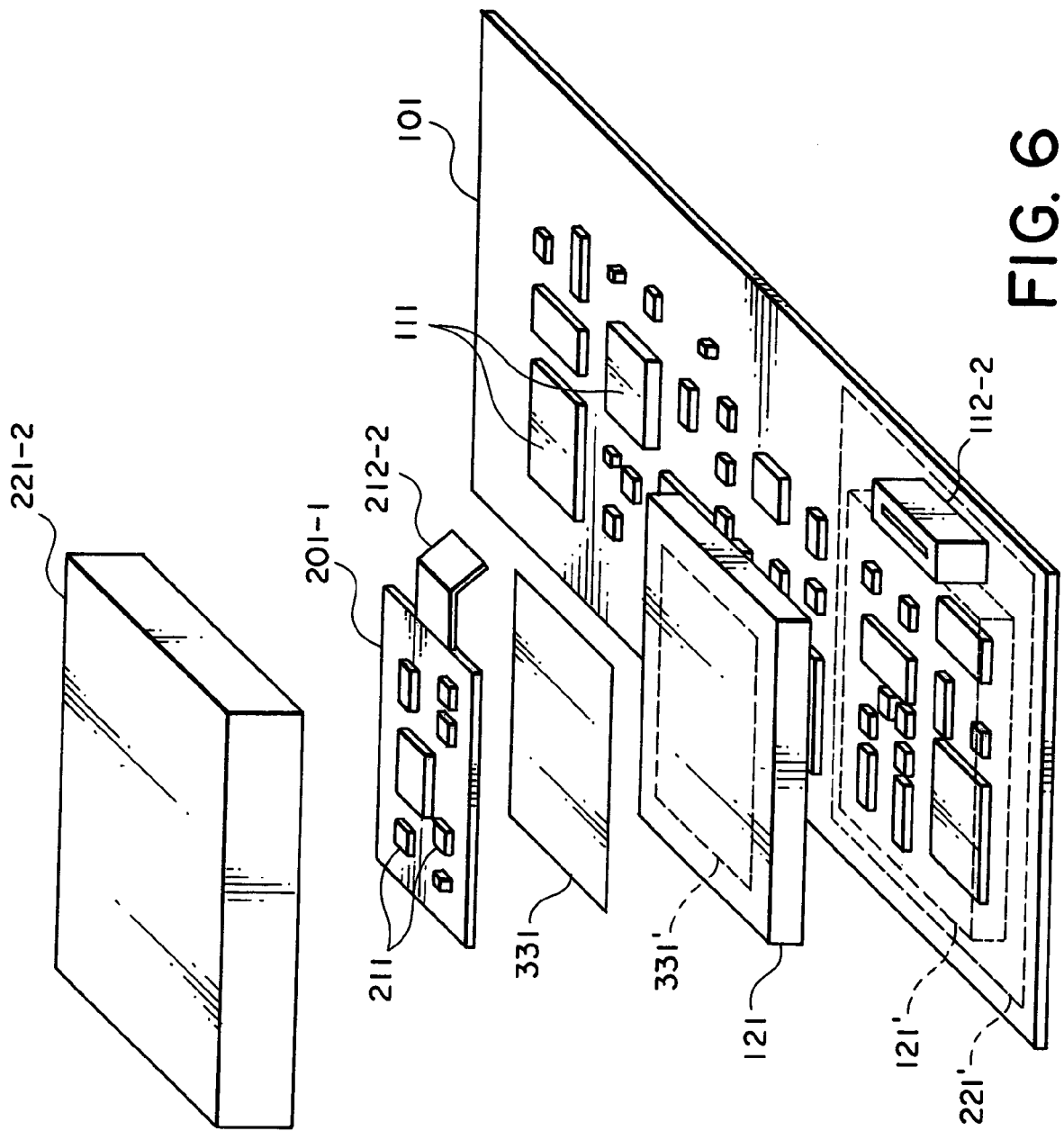
FIG. 6 is an exploded perspective view of a second embodiment of compact radio equipment according to present invention.

In FIG. 6, similar members to those shown in the first embodiment are used for the first printed circuit board 101, the first electric circuits 111, the first shield frame 121, the second printed circuit board 201-1, the second electric circuits 211, a second shield frame 221-2, a connector 112-2, and the jointing material 331.

Figure 7:
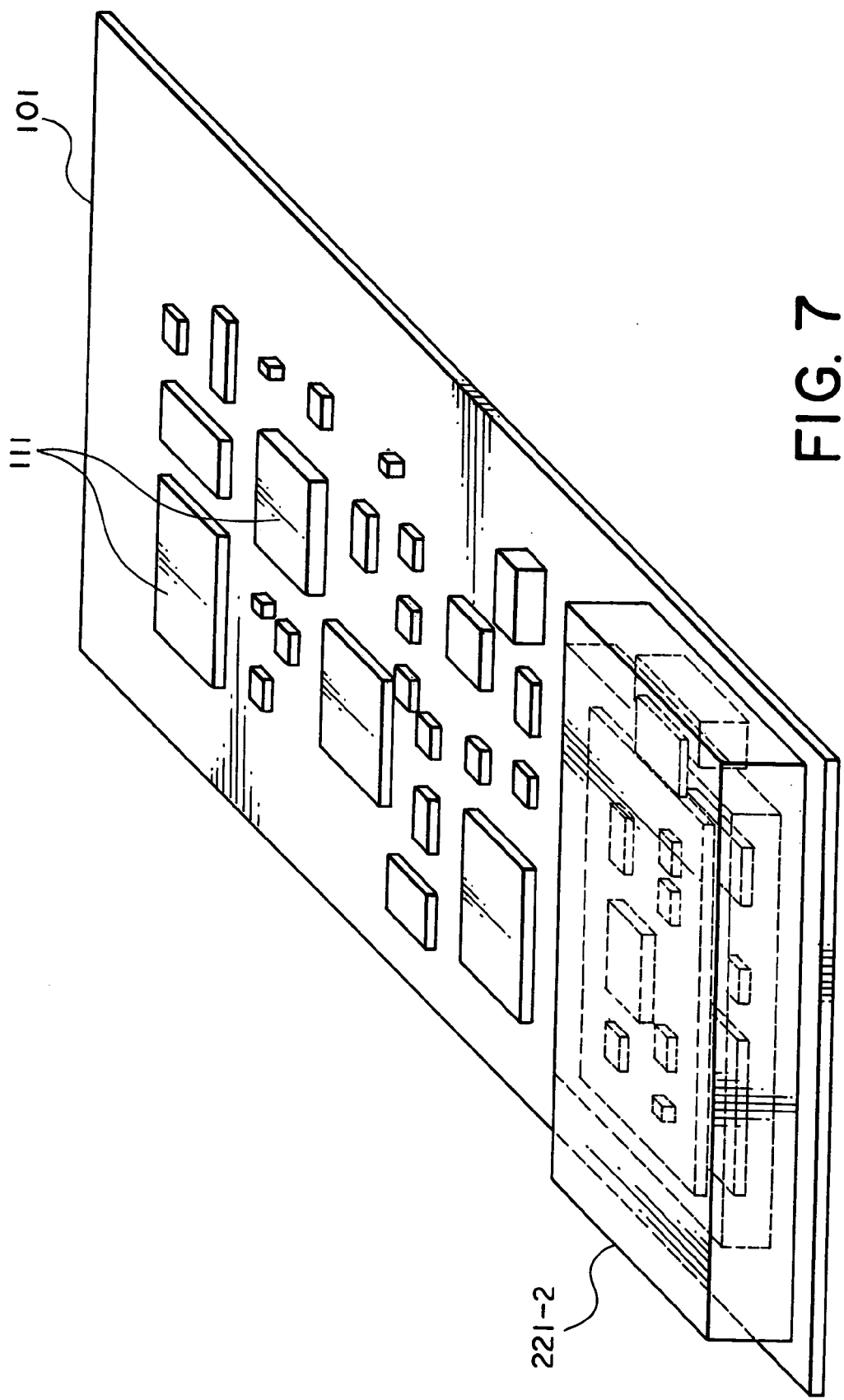
FIG. 7 is an external perspective view showing a state in which the first electric circuits, the first shield frame, the second printed circuit board, the second electric circuits, and the second shield frame, all of which are shown in FIG. 6, are mounted.

In the first embodiment, the second shield frame 221-1 is mounted on the first shield frame 121. On the other hand, in the second embodiment, the second shield frame 221-2 is mounted on the first printed circuit board 101 as shown in FIGS. 6 and 7 to cover the first shield frame 121 and the connector 112-2 together with the second printed circuit board 201-1 with the second electric circuits 211 mounted on it. Indicated by dashed lines 221' in FIG. 6 is the mounting location of the second shield frame 221-2 on the first printed circuit board 101.

As also described in the first embodiment, the second printed circuit board 201-1 takes the form of a flexible substrate. In this case, it has a contact terminal area 212-2 instead of the receptor. The contact terminal area 212-2 is inserted into the connector 112-2 to connect the first electric circuits 111 and the second electric circuits 211 through the power, signal, and ground lines. Like in the first embodiment, the bottom layer of the second printed circuit board 201-1 is formed in a ground pattern, the entire surface of which is covered with an exposed copper foil layer, or plated with gold or nickel, or coated with silver so that it can contact the first shield frame 121 and the jointing material 331 for conduction of electricity.

FIG. 7 is an external perspective view showing a state in which all the components shown in FIG. 6, namely, the first electric circuits, the first shield frame, the second printed circuit board, the second electric circuits, and the second shield frame are mounted. In other words, FIG. 7 shows a state in which all the structural components of the present invention shown in FIG. 6, namely, the first electric circuits 111, the first shield frame 121, the second printed circuit board 201, the second electric circuits 211, the second shield frame 221-2, the connector 112-2, the contact terminal area 212-2, and the jointing material 331 are mounted on the first printed circuit board 101.

(Operation of Second Embodiment)

Figure 8:
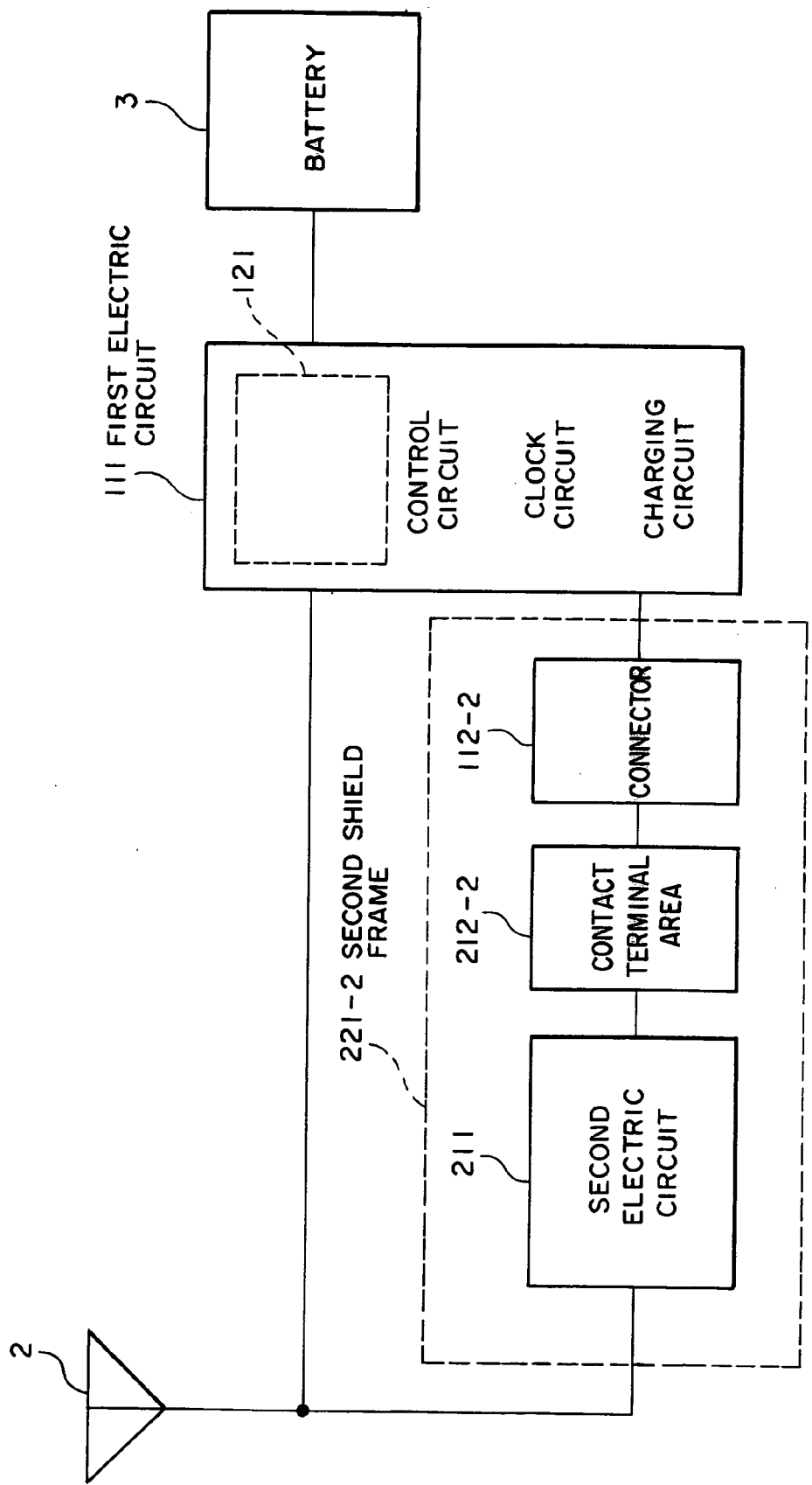
FIG. 8 is a block diagram showing the operation and structure of the second embodiment according to the present invention.

FIG. 8 is a block diagram showing the operation and structure of the second embodiment of the present invention.

Cell phones are a typical example of the compact radio equipment. With the recent speed increase in cell phone systems, equipment with two or more radio circuits has been commercially available to meet the need to use both of conventional and next-generation cell phone systems. Referring to FIG. 8, such compact radio equipment with two or more radio circuits will be described.

In FIG. 8, a second radio circuit corresponds to one of the second electric circuits 211 of FIG. 6 that are mounted on the second printed circuit board 201-1. The contact terminal area 212-2 and the connector 112-2 of FIG. 8 correspond to the contact terminal area 212-2 and the connector 112-2 of FIG. 6. A control electric circuit, a charger electric circuit, a clock electric circuit, and a first radio circuit of FIG. 8 correspond to the electric circuits 111 of FIG. 6 that are mounted on the first printed circuit board 101.

In the second embodiment, the first radio circuit is mounted as shown in FIG. 6 in a position to be covered by the first shield frame 121. The first shield frame 121 is made of conductive metal to shield electromagnetic wave noise, so that not only can the radiation of noise from the internal electric circuits be reduced, but the influence of noise from the outside can also be reduced. The first shield frame 121 is soldered to the first printed circuit board 101. In this manner, both the radiation of noise and the noise interference can be reduced. In this event, solder joints are formed to have ground potential. Therefore, if the area of the solder joints is increased, the first shield frame 121 can have the same ground potential as the first printed circuit board 101. Thus, thermal conductivity can be increased not only to improve heat radiation efficiency but also to make the equipment more resistant to the radiation and interference of noise. Thereby, the action of the first radio circuit is stabilized so as to improve its properties.

Further, the first shield frame 121 is mechanically secured to the first printed circuit board 101 so as to protect the internal electric circuits.

The second radio circuit is mounted on the second printed circuit board 201-1 shown in FIG. 6. The entire surface layer on the bottom side of the second printed circuit board 201-1 is formed as a ground layer, brought into contact with the jointing material 331, and connected to the first shield frame 121. This allows the second printed circuit board 201-1 with the second radio circuit mounted on it to have the same ground potential as the first printed circuit board 101. Therefore, their ground potentials remain stable so as to improve the properties of the second radio circuit. Further, heat generated from the first radio circuit, the second radio circuit, and the other electric circuits on the first printed circuit board 101 can be dissipated into the shield frames 121, 221-2. Thus, heat radiation efficiency can be improved.

In the first embodiment shown in FIG. 1, the second shield frame 221-1 is mounted on the first shield frame 121 with the connector 112-1 and the receptor 212-1 mounted outside the second shield frame 221-1.

On the other hand, in the second embodiment shown in FIG. 6, the second shield frame 221-2 is formed to cover the connector 112-2 and the terminal connection part 212-2 together with the second printed circuit board 201-1, and mounted on the first printed circuit board 101. The second shield frame 221-2 is mounted on the first printed circuit board 101 so as to cover the second printed circuit board 201-1, the connector 112-2, and the terminal connection part 212-2. Therefore, the radiation of noise from the second radio circuit and the noise interference with the second radio circuit can be reduced.

Further, if the second shield frame 221-2 covers the first shield frame 121 in such a manner that the inner side faces of the second shield frame 221-2 are brought into contact with the outer side faces of the first shield frame 121, their ground potential effects can be further enhanced. Consequently, thermal conductivity is increased to further improve heat radiation efficiency.

In the second embodiment, the first shield frame 121 with the second printed circuit board 201-1 mounted on it is mounted on the first printed circuit board 101, and the second shield frame 221-2 is mounted on the first printed circuit board 101 in such a manner to cover the first shield frame 121 with the second printed circuit board 201-1 mounted on it. This structure enhances mounting efficiency and hence makes the equipment smaller and thinner.

Since the compact radio equipment of the second embodiment can be manufactured without use of conventional resin molded or die-cast frames, the cost of each component can be reduced. Moreover, additional elements to fix the components are unnecessary and therefore, the cost of the equipment can also be reduced.

(Third Embodiment)

Subsequently, description will be made of a third embodiment of the present invention.

(Structure of Third Embodiment)

Figure 9:
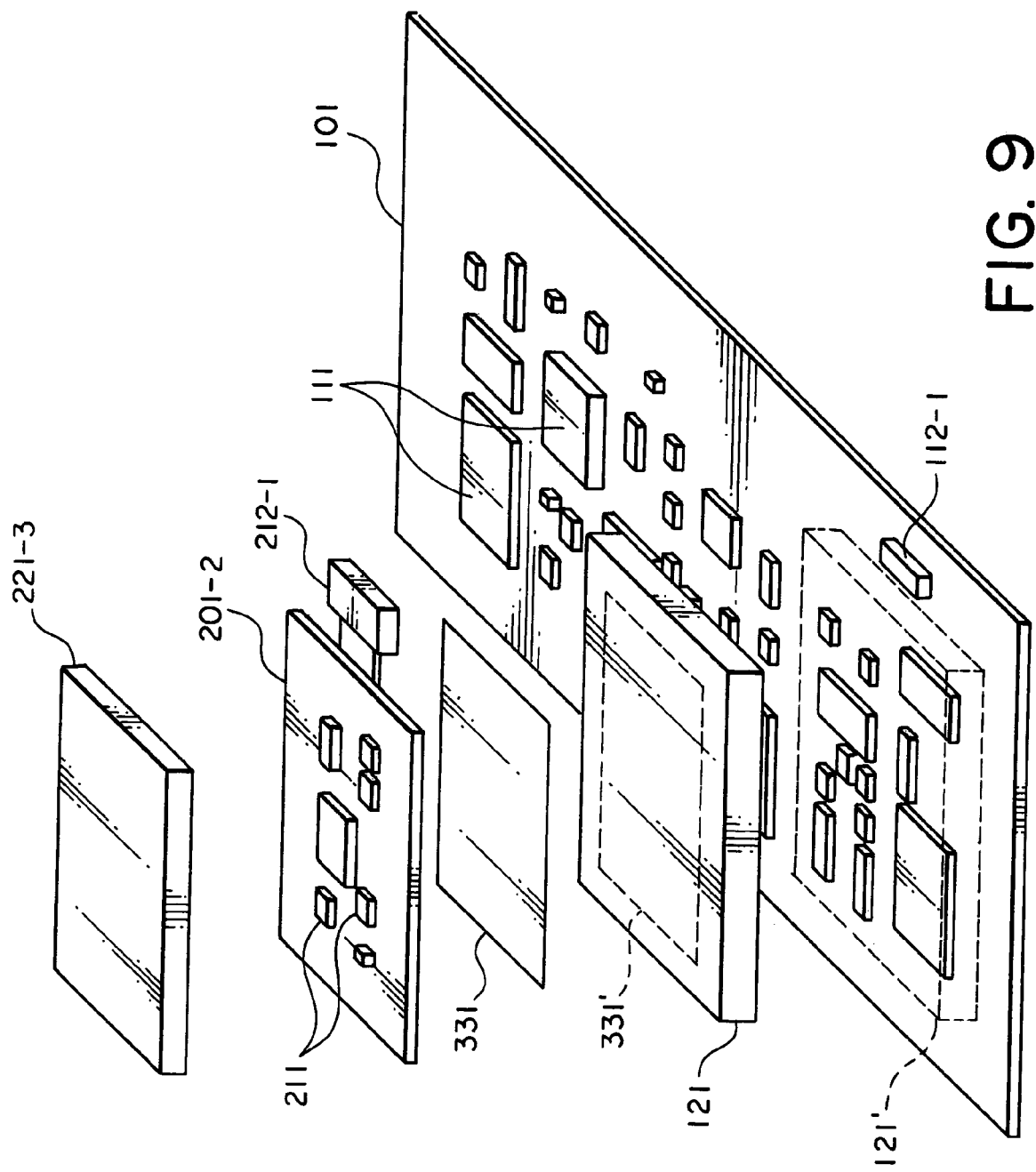
FIG. 9 is an exploded perspective view of a third embodiment of compact radio equipment according to present invention.

Referring to FIG. 9, description will be made of a structure of a third embodiment according to the present invention.

In FIG. 9, similar members to those shown in the first embodiment are used for the first printed circuit board 1 01, the first electric circuits 111, the first shield frame 121, a second printed circuit board 201-2, the second electric circuits 211, a second shield frame 221-3, the connector 11 2-1, the receptor 212-1, and the jointing material 331.

In the first embodiment, the second shield frame 221-1 is mounted on the top plate of the first shield frame 121 in such a manner to cover the second electric circuits 211 and the second printed circuit board 201-1. On the other hand, in the third embodiment shown in FIGS. 9 and 10, the second shield frame 221-3 is mounted on the second printed circuit board 201-2 with the second electric circuits 211 mounted on it.

Figure 10:
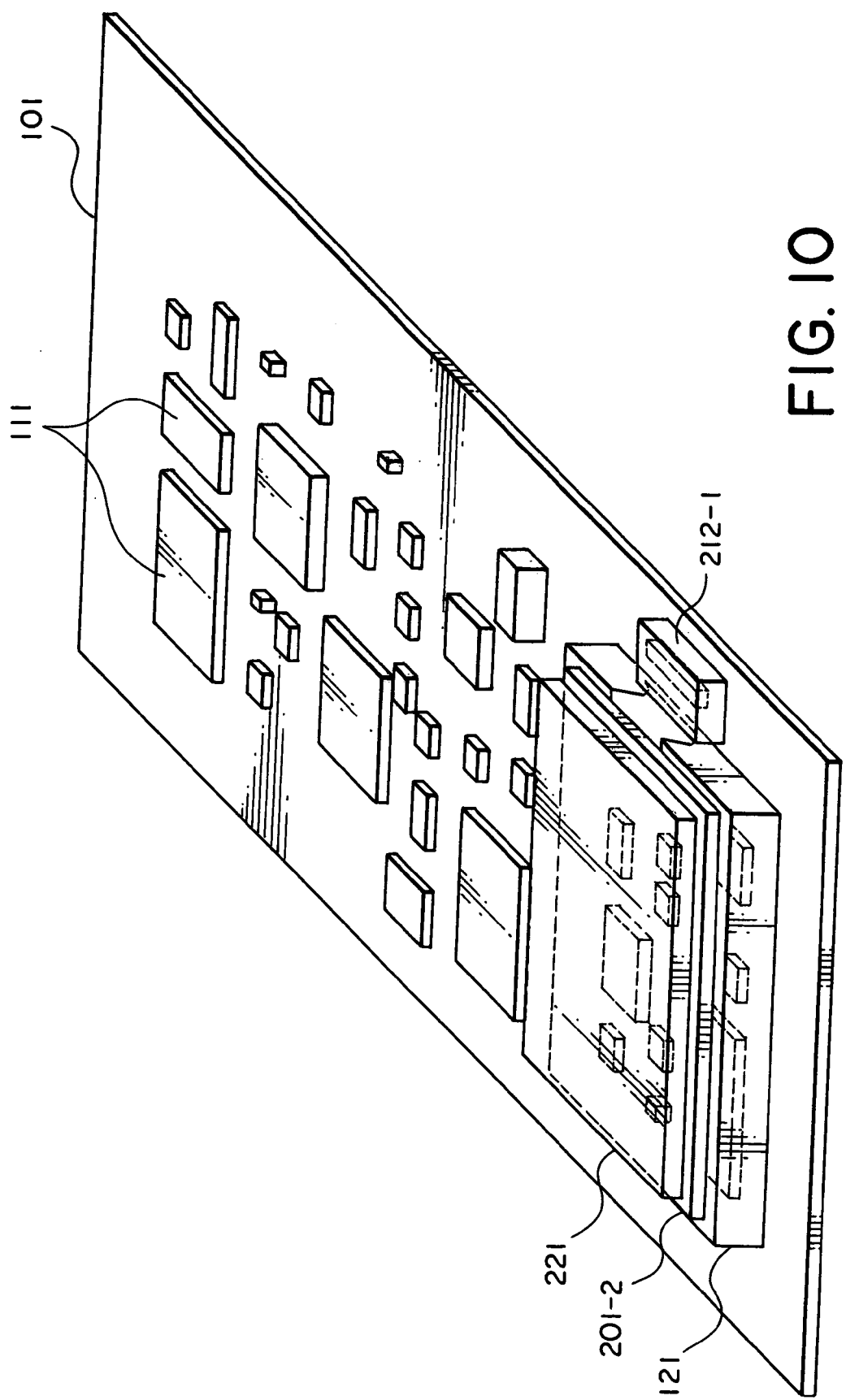
FIG. 10 is an external perspective view showing a state in which the first printed circuit board, the first electric circuits, the first shield frame, the second printed circuit board, the second electric circuits, and the second shield frame, all of which are shown in FIG. 9, are mounted.

FIG. 10 is an external perspective view showing a state in which all the components shown in FIG. 9, namely, the first printed circuit board, the first electric circuits, the first shield frame, the second printed circuit board, the second electric circuits, and the second shield frame are mounted.

When the second printed circuit board 201-2 is mounted on the outside surface of the top plate of the first shield frame 121 through the jointing material 331, a double-sided conductive tape is used as the jointing material 331. Alternatively, the second printed circuit board 201-2 may be soldered onto the outside surface of the top plate of the first shield frame 121. As mentioned in the first and second embodiments, if the second electric circuits 211 are high-frequency electric circuits, the jointing material 331 may be ordinary double-sided tape.

(Operation of Third Embodiment)

The first shield frame 121 of conductive metal shields electromagnetic wave noise, so that not only can the radiation of noise from the first electric circuits 111 be reduced, but the influence of noise from the outside can also be reduced. The first shield frame 121 is soldered to the first printed circuit board 101. In this manner, both the radiation of noise and the noise interference can be suppressed. In this event, solder joints are formed to have ground potential. Therefore, if the area of the solder joints is increased, the first shield frame 121 can have the same ground potential as the first printed circuit board 101, and consequently, it can be more resistant to the radiation and interference of noise. This makes it possible not only to stabilize the action of the electric circuits and improve their properties, but also to further improve thermal conductivity and heat radiation efficiency. Moreover, the first shield frame 121 is mechanically secured to the first printed circuit board 101, and therefore, the internal electric circuits can be protected.

The second electric circuits 211 are mounted on the second printed circuit board 201-2. The entire surface layer on the bottom side of the second printed circuit board 201-2 is formed as a ground layer, brought into contact with the jointing material 331, and connected to the first shield frame 121. This allows the second printed circuit board 201-2 with the second electric circuits 211 mounted on it to have the same ground potential as the first shield frame 121 and the first printed circuit board 101. Therefore, their ground potentials remain stable so as to improve the properties of the second electric circuits 211. The second shield frame 221-3 is soldered to the second printed circuit board 201-2, so that both the radiation of noise and the noise interference can be reduced. In this event, solder joints are formed to have ground potential. If the area of the solder joints is increased, the second shield frame 221-3 can have the same ground potential as the second printed circuit board 201-2, and it can be more resistant to the radiation and interference of noise. Thus, not only is the action of the electric circuits stabilized to improve their properties, but the thermal conductivity is also increased to improve heat radiation efficiency.

In the third embodiment, the second shield frame 221-3 is formed to cover the second electric circuits 211 on the second printed circuit board 201-2, and mounted on the second printed circuit board 201-2. The second printed circuit board 201-2 is mounted on the top plate of the first shield frame 121. Therefore, the second printed circuit board 201-2 can have the same ground potential as the first shield frame 121 and the first printed circuit board 101. Thus, it can be more resistant to the radiation and interference of noise so as to stabilize the action of the electric circuits and improve their properties. Under this circumstance, the second printed circuit board 201-2 is soldered onto the second shield frame 121 so that both the radiation of noise and the noise interference can be further suppressed. Solder joints are formed to have ground potential. Therefore, if the area of the solder joints is increased, the second printed circuit board 201-2 can have the same ground potential as the first shield frame 121 and the first printed circuit board 101. In this manner, it can be more resistant to the radiation and interference of noise. As a consequence, not only is the action of the electric circuits stabilized to improve their properties, but the thermal conductivity is also increased to improve heat radiation efficiency.

The entire surface layer on the bottom side of the second printed circuit board 201-2 is formed as a ground layer. It is assumed that the second electric circuits 211 are high-frequency radio circuits. If the distance between the second printed circuit board 201-2 and the first shield frame 121 is lessened, the copper foil on the bottom face of the second printed circuit board 201-2 and the metal plate of the first shield frame 121 will be able to function as a capacitor to conduct the ground potential in the RF band. In this case, the jointing material 331 does not need to be conductive, and it may be ordinary double-sided tape as long as it can fix the second printed circuit board 201-2. Further, if the second electric circuits 211 are high-frequency radio circuits, the second printed circuit board 201-2 can be soldered and secured to the first shield frame 121. In this case, the double-sided tape to fix the second printed circuit board 201-2 is unnecessary, thereby enabling cost cutting.

(Fourth Embodiment)

Subsequently, description will be made of a fourth embodiment of the present invention.

(Structure of Fourth Embodiment)

Figure 11:
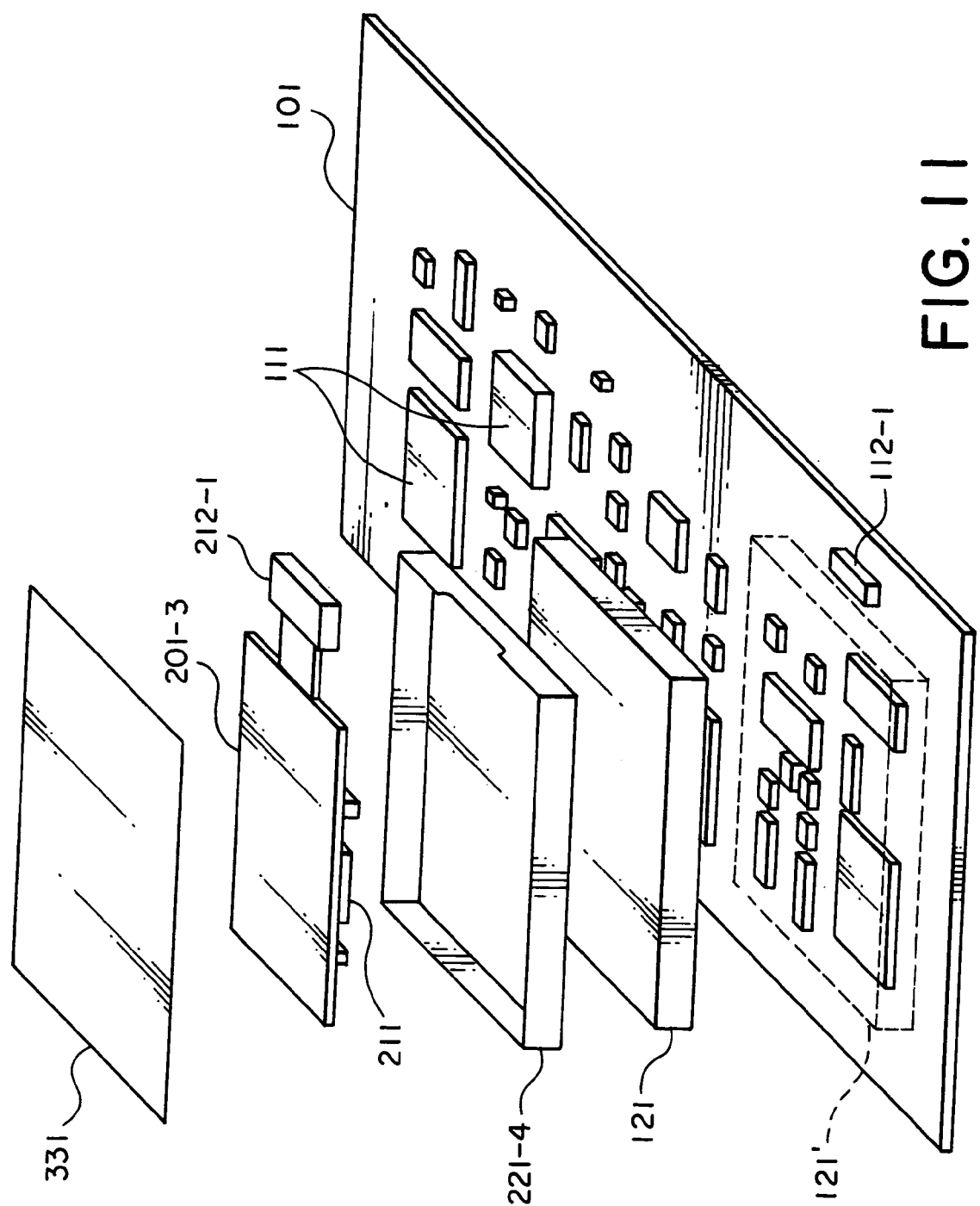
FIG. 11 is an exploded perspective view of a fourth embodiment of compact radio equipment according to present invention.

Referring to FIG. 11, description will be made of a structure of a fourth embodiment according to the present invention.

As shown in FIG. 11, the compact radio equipment according to the present invention includes the first printed circuit board 101, the first electric circuits 111, the first shield frame 121, a second printed circuit board 201-3, the second electric circuits 211, a second shield frame 221-4, the connector 112-1, the receptor 212-1, and the jointing material 331.

A different point between the compact radio equipment shown in FIG. 11 and the compact radio equipment shown in FIG. 1 is that the top plate of the first shield frame 121 and the top plate of the second shield frame 221-4 are joined together in such a manner that the component mounting side of the first printed circuit board 101 and the component mounting side of the second printed circuit board 201-3 face each other.

As shown in FIG. 12, the compact radio equipment shown in FIG. 11 also includes the main-unit case 1, the antenna 2, the battery 3, the switches 4, and the display part 5.

In FIG. 11, the first electric circuits 111 and the second electric circuits 211 are electric circuits of the compact radio equipment, and they are divided into blocks and mounted on two or more printed circuit boards due to limitations on mounting size and electrical properties.

The first printed circuit board 101 and the second printed circuit board 201-3 mount the first electric circuits 111 and the second electric circuits 211, respectively, with signal patterns formed on their surfaces or in their internal layers. Thus, the electric circuitry of the compact radio equipment is formed. The connector 112-1 and the receptor 212-1 electrically connect the first electric circuits 111 and the second electric circuits 211 through the power, signal, and ground lines. The connector 112-1 may be a stacking type connector, or of the type into which a flexible substrate is inserted. In other words, any part or shape can be used for the connector 112-1 as long as it connects the electric circuits 211 on the second printed circuit board 201-3 and the electric circuits 111 on the first printed circuit board 101.

Although the receptor 212-1 assumes the form of a stacking receptor part attached to the second printed circuit board 201-3, if the second printed circuit board 201-3 takes the form of a flexible substrate with a contact terminal area formed on it, there will be no need to attach the stacking receptor part. Like the connector 112-1, any part or shape can be used for the receptor 212-1 as long as it connects the electric circuits 211 on the second printed circuit board 201-3 with the electric circuits 111 on the first printed circuit board 101.

(Operation of Fourth Embodiment)

The first shield frame 121 of conductive metal shields electromagnetic wave noise. Thus, not only can the radiation of noise from the first electric circuits 111 be reduced, but the influence of noise from the outside can also be reduced. The first shield frame 121 is soldered to the first printed circuit board 101 so that both the radiation of noise and the noise interference can be reduced. Solder joints are formed to have ground potential. Therefore, if the area of the solder joints is increased, the first shield frame 121 can have the same ground potential as the first printed circuit board 101. As a consequence, it can be more resistant to the radiation and interference of noise. This makes it possible not only to stabilize the action of the electric circuits and improve their properties, but also to further improve thermal conductivity and heat radiation efficiency. Moreover, the first shield frame 121 is mechanically secured to the first printed circuit board 101. Therefore, the internal electric circuits can be protected.

The second electric circuits 211 are mounted on the second printed circuit board 201-3. The entire surface layer on the bottom side of the second printed circuit board 201-3 is formed as a ground layer, brought into contact with the jointing material 331, and connected to the first shield frame 121. This allows the second printed circuit board 201-3 with the second electric circuits 211 mounted on it to have the same ground potential as the first shield frame 121 and the first printed circuit board 101. Therefore, their ground potentials remain stable so as to improve the properties of the second electric circuits 211. The second shield frame 221-4 is soldered to the second printed circuit board 201-3. In this manner, the radiation of noise and the noise interference can be suppressed. Solder joints are formed to have ground potential. If the area of the solder joints is increased, the second shield frame 221-4 can have the same ground potential as the second printed circuit board 201-3. As a consequence, it can be more resistant to the radiation and interference of noise, Thus, not only is the action of the electric circuits stabilized to improve their properties, but the thermal conductivity is also increased to improve heat radiation efficiency.

In the fourth embodiment, the second shield frame 221-4 is formed to cover the second electric circuits 211 on the second printed circuit board 201-3, and mounted on the second printed circuit board 201-3. Since the second printed circuit board 201-3 is mounted on the jointing material or connection board 331, the second printed circuit board 201-3 can have the same ground potential as the first shield frame 121 and the first printed circuit board 101. Therefore, it can be more resistant to the radiation and interference of noise. Thereby, the action of the electric circuits is stabilized so as to improve their properties. In this event, the second printed circuit board 201-3 can be soldered onto the connection board 331 to further reduce both the radiation of noise and the noise interference. Solder joints are formed to have ground potential. Therefore, if the area of the solder joints is increased, the second printed circuit board 201-3 can have the same ground potential as the first shield frame 121 and the first printed circuit board 101. Consequently, it can be more resistant to the radiation and interference of noise. Thus, not only is the action of the electric circuits stabilized to improve their properties, but the thermal conductivity is also increased to improve heat radiation efficiency.

The entire surface layer on the bottom side of the second printed circuit board 201-3 is formed as a ground layer. It is assumed here that the second electric circuits 211 are high-frequency radio circuits. If the distance between the second printed circuit board 201-3 and top plate of the second shield frame 221-4 is lessened, the copper foil on the bottom face of the second printed circuit board 201-3 and the metal plate of the second shield frame 221-4 will be able to function as a capacitor to conduct the ground potential in the RF band.

As described above, the present invention is applicable to compact radio equipment, such as a cell phone or PHS (Personal Handyphone System), and its mounting method, in which internal electric circuits are mounted on two or more printed circuit boards electrically connected to each other and securely mounted in the structure.

While the present invention has thus far been disclosed in conjunction with several embodiments thereof, it will be readily possible for those skilled in the art to put the present invention into practice in various other manners.

What is claimed is:

1. Compact radio equipment comprising:
    a first metal shield frame mounted on a first printed circuit board and covering a first component mounted on the first printed circuit board;
    a second printed circuit board mounted on the first metal shield frame; and
    a second metal shield frame which covers the second printed circuit board;
    wherein the second metal shield frame is mounted on the first metal shield frame at a portion of the first metal shield frame which covers the first component mounted part.

2. Compact radio equipment according to claim 1, wherein the second printed circuit board is electrically and mechanically connected to the first metal shield frame so that a bottom surface layer opposite to a component mounting surface is a ground layer.

3. Compact radio equipment according to claim 1, wherein the second printed circuit board is electrically connected to the first metal shield frame so that a bottom surface layer opposite to a component mounting surface is a ground layer, and the second printed circuit board is structured by a radio circuit.

4. Compact radio equipment comprising:
    a first metal shield frame mounted on a first printed circuit board to cover a first component mounted on the first printed circuit board;
    a second printed circuit board mounted on the first metal shield frame;
    a second metal shield frame to cover the second printed circuit board; and
    wherein the second shield frame is mounted on the second printed circuit board.

5. Compact radio equipment according to claim 1, wherein the equipment serves as a cell-phone or a PHS terminal.

6. A method of mounting compact radio equipment comprising the steps of mounting a first metal shield frame on a first printed circuit board to cover a component mounted on the first printed circuit board; mounting a second printed circuit board on the first metal shield frame; and covering the second printed circuit board with a second metal shield frame mounted on the first metal shield frame at a portion of the first metal shield frame which covers the first component mounted part.

7. A mounting method according to claim 6, wherein: the second printed circuit board is electrically and mechanically connected to the first metal shield frame so that a bottom surface layer opposite to a component mounting surface is a ground layer.

8. A mounting method according to claim 6, wherein the second printed circuit board is electrically connected to the first metal shield frame so that a bottom surface layer opposite to a component mounting surface is a ground layer, and the second printed circuit board is structured by a radio circuit.

9. A method of mounting compact radio equipment comprising the steps of mounting a first metal shield frame on a first printed circuit board to cover a component mounted on the first printed circuit board; mounting a second printed circuit board on the first metal shield frame; and covering the second printed circuit board with a second metal shield frame, wherein the second shield frame is mounted on the second printed circuit board.

10. A mounting method according to claim 6, wherein the equipment serves as a cell-phone or a PHS terminal.

11. Compact radio equipment according to claim 1, wherein the first printed circuit board is electrically connected to the second printed circuit board.

12. Compact radio equipment according to claim 11, wherein the first printed circuit board is electrically connected to the second printed circuit board by a receptor and a connector.

13. Compact radio equipment according to claim 4, wherein the first printed circuit board is electrically connected to the second printed circuit board.

14. A mounting method according to claim 6, wherein the first printed circuit board is electrically connected to the second printed circuit board.

15. A mounting method according to claim 9, wherein the first printed circuit board is electrically connected to the second printed circuit board.

16. Compact radio equipment comprising:
    a first metal shield frame mounted on a first printed circuit board and covering a first component mounted on the first printed circuit board;
    a second printed circuit board mounted on the first metal shield frame; and
    a second metal shield frame which covers the second printed circuit board;
    wherein the second metal shield frame is mounted on the first printed circuit board.

17. Compact radio equipment according to claim 16, wherein second metal shield frame covers the first metal shield frame.

* * * * *